United States Patent [19]

Jones et al.

[11] 4,432,134

[45] Feb. 21, 1984

[54] PROCESS FOR IN-SITU FORMATION OF NIOBIUM-INSULATOR-NIOBIUM JOSEPHSON TUNNEL JUNCTION DEVICES

[75] Inventors: Addison B. Jones, Yorba Linda; Francis M. Erdmann, Anaheim, both of Calif.

[73] Assignee: Rockwell International Corporation, El Segundo, Calif.

[21] Appl. No.: 376,483

[22] Filed: May 10, 1982

[51] Int. Cl.³ .................... H01L 39/24; H01L 39/22
[52] U.S. Cl. ........................................ 29/578; 29/591; 29/599; 357/5; 427/62
[58] Field of Search .................... 29/578, 591, 599; 357/5, 27; 427/62

[56] References Cited

U.S. PATENT DOCUMENTS 4,316,785  2/1982  Suzuki et al. .................... 357/5 X

OTHER PUBLICATIONS

Matsuda, A. et al., "Study of Nb–Based Josephson Tunnel Junctions," in J. Appl. Phys. 51(8), Aug. –1980.

*Primary Examiner*—Brian E. Hearn
*Assistant Examiner*—Alan E. Schiavelli
*Attorney, Agent, or Firm*—H. F. Hamann; Daniel R. McGlynn

[57] ABSTRACT

A method of forming a superconductor-barrier-superconductor junction device by the steps of depositing a first superconductive layer on a substrate, forming a barrier layer on the first superconductive layer and depositing a second superconductive layer on the barrier layer. A layer of photoresist is then deposited over the second superconductive layer and patterned together with the second superconductive layer to form a mesa structure. A dielectric layer is deposited over the mesa structure, and the photoresist layer portion is dissolved thereby lifting off the dielectric portion overlying said second superconductive layer portion.

10 Claims, 10 Drawing Figures

PROCESS FOR IN-SITU FORMATION OF NIOBIUM-INSULATOR-NIOBIUM JOSEPHSON TUNNEL JUNCTION DEVICES

BACKGROUND

1. Field of the Invention

The invention relates to superconductive devices, and in particular to a method of fabrication of niobium tunnel junction devices.

2. Description of the Prior Art

Superconductive Josephson memory and logic circuits are known in the art which utilize the Josephson tunnel junction as the active switching elements or gates therefor. The Josephson junction comprises two superimposed layers of superconductive material with an insulator or semiconductor layer or barrier therebetween whereby Josephson tunneling current flows from one superconductive layer to the other through the barrier via the Josephson tunneling effect. With the superconductive layers connected into a superconductive loop and control lines disposed adjacent the junction, the d.c. Josephson zero voltage current flowing through the device may be controlled as to provide the necessary current steering control functions in the Josephson circuitry.

Nb-Insulator-Nb tunnel junctions offer distinct advantages, in both performance and reliability, over similar junctions made with other superconducting materials (such as Pb and Pb alloys). Nb is stronger, has a higher superconducting transition temperature and is more resistant to degradation from thermal cycling. Furthermore, an oxide of Nb ($Nb_2O_5$) is just an excellent dielectric that is suitable as the tunneling insulator in Josephson tunnel junctions.

Sequences used to date to fabricate Nb tunnel junctions require fabrication steps where sensitive device surfaces are exposed to undesirable contaminants. The tunneling oxide layers must be formed on a surface that has been exposed to the atmosphere, covered with photoresist materials and been subjected to various chemical plasma or sputtering cleaning procedures. In most cases, the ultra-thin oxide (<50 angstroms) itself is exposed to and contaminated by the atmosphere between its formation and the Nb counter electrode deposition. In any case, controlled Nb-Insulator-Nb devices have not been achievable using prior art fabrication techniques.

SUMMARY OF THE INVENTION

Briefly, and in general terms, the invention is a method of forming a niobium-insulator-niobium junction device by the steps of depositing a first niobium layer on a substrate; forming a barrier layer on the first niobium layer; depositing a second niobium layer on the barrier layer; depositing a layer of photoresist over the second niobium layer; patterning the layers of photoresist and the second layer of niobium to form a mesa structure; depositing a dielectric layer over the mesa structure; and dissolving the photoresist layer portion, thereby lifting-off the dielectric portion overlying the second niobium layer portion. Although the device constructed is referred to as a "niobium-insulator-niobium" junction device, it is understood that the invention is more generally a superconductor-barrier layer-superconductor junction device.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENTS

Turning to the Figures, there is illustrated a sequence of process steps for the in-situ formation of a Nb-insulator-Nb Josephson junction structure according to the present invention. The formation of the composite structure is described in the sequence of FIGS. 1a through 1j. Although the superconductive material chosen in the exemplary is niobium (Nb), other superconductive materials such as Pb or lead alloys can be used as well.

Figure 1A:
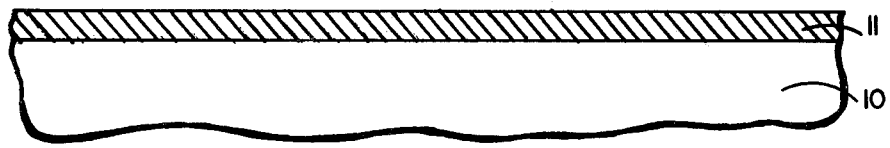
FIG. 1a is a first step in the process sequence according to the present invention showing the deposition of a layer of superconductive material on a substrate.

FIG. 1a shows the deposition of a Nb layer 11 on suitable substrate 10. The Nb layer preferably has a thickness of about 3500 angstroms, and is deposited by any suitable technique such as electron beam evaporation or sputtering. The substrate is preferably an insulator such as sapphire or $SiO_2$ on silicon.

Figure 1B:
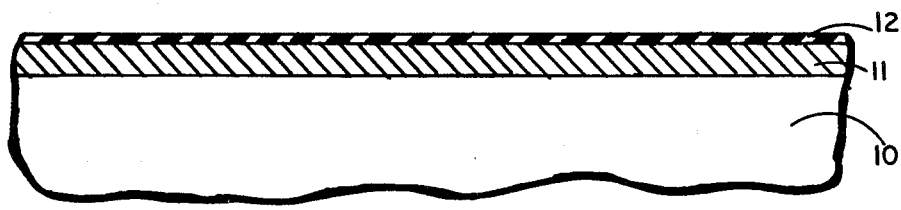
FIG. 1b is a second step in the process sequence according to the present invention showing the formation of a barrier layer on the layer of superconductive material.

FIG. 1b shows the formation of a thin tunneling barrier layer 12 on the surface of the Nb layer 11. The barrier material is preferably $Nb_2O_5$, and has a tunneling thickness of approximately 40 angstroms. The barrier is formed by means of sputtering, evaporation, or in-situ oxidation of the first niobium layer. Alternately, another appropriate insulating or semiconducting barrier layer could be used.

Figure 1C:
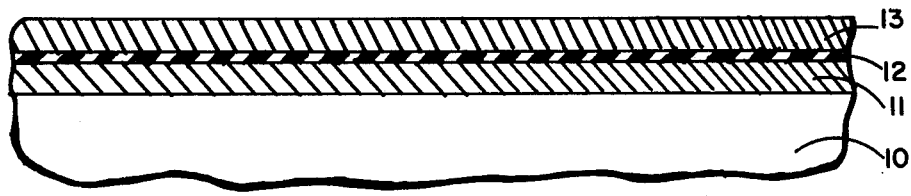
FIG. 1c is a third step in the process sequence according to the present invention, showing deposition of a second layer of superconductive material on the layer of insulating material.

The next step, as shown in FIG. 1c, is to deposit a second Nb layer 13 over the tunneling barrier layer 12. The second Nb layer 13 preferably has a thickness of about 3000 angstroms.

The steps represented in 1a, 1b and 1c are intended to be performed in sequence without removing the substrate from the controlled atmosphere of the deposition system.

Figure 1D:
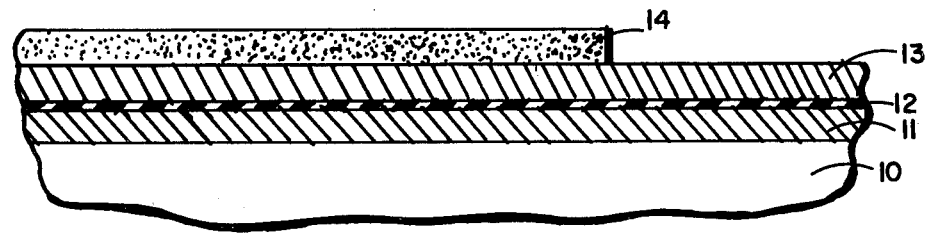
FIG. 1d is a fourth step in the process sequence according to the present invention showing the deposition of a layer of photoresist and the patterning of the layer to define the lower electrode geometry.
Figure 1E:
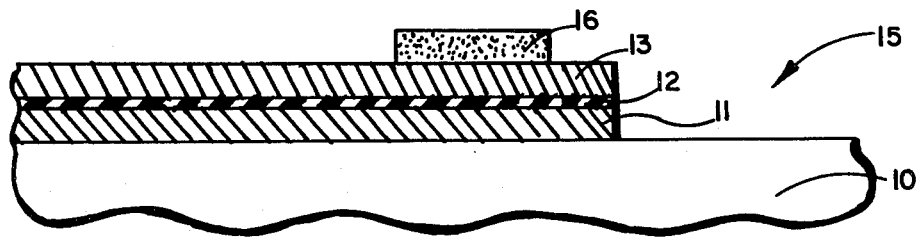
FIG. 1e is a fifth step in the process sequence according to the present invention, showing the etching of the two layers of superconductive material in a first region on said substrate, and the deposition of a photo-resist pattern on the major surface of the second layer of superconductive material.

The next step is to define the lower electrode geometry by photolithographic techniques, as shown in FIGS. 1d–1e. A layer of photoresist 14 is deposited on the second Nb layer and patterned in those areas where required where the junction structures are ultimately to be formed. FIG. 1d shows the photoresist pattern for defining the lower electrode geometry. Following the photoresist patterning of FIG. 1d, an etchant is applied to the surface and the composite is etched through both Nb layers down to the substrate 10, forming a cavity 15 as shown in FIG. 1e. Another photoresist pattern 16 is then formed on the upper surface of the composite.

Figure 1F:
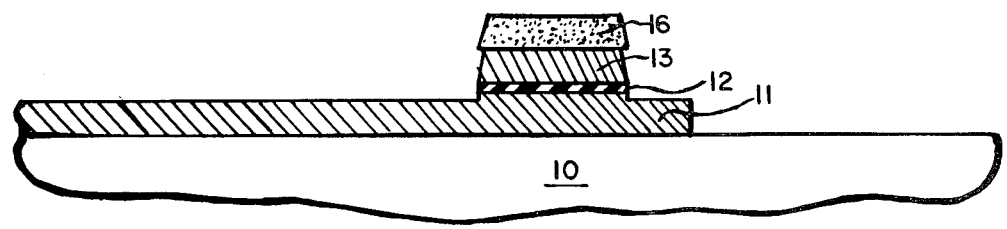
FIG. 1f is a sixth step in the process sequence according to the present invention, showing the etching through the second layer of superconductive material and through the insulating material and slightly into the first layer of superconductive material in predetermined regions.

FIG. 1f illustrates the next step in the process sequence in which the photoresist pattern 16 is used as a mask and the composite is etched entirely through the upper niobium layer 13, entirely through the dielectric layer 12, and into a small portion of the lower niobium layer 11. Alternatively, one can at this point remove the masking resist, deposit a dielectric, and open a contact hole to the upper superconducting layer. In such an embodiment, steps 1g and 1h would be omitted.

Figure 1G:
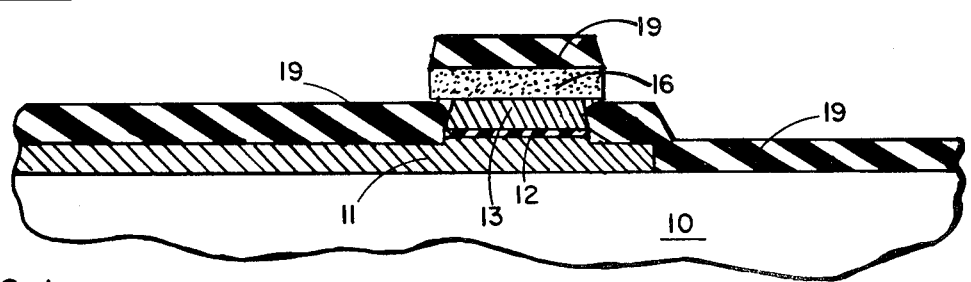
FIG. 1g is a seventh step in the process sequence according to the present invention, showing the deposition of a layer of dielectric material over the exposed regions of said substrate.

FIG. 1g shows the next step in the process sequence in which a layer of dielectric material such as silicon dioxide or silicon monoxide 19 is deposited over the entire exposed portion of the composite. The dielectric layer preferably has a thickness of 3500 angstroms, and is deposited by sputtering or evaporation.

Figure 1H:
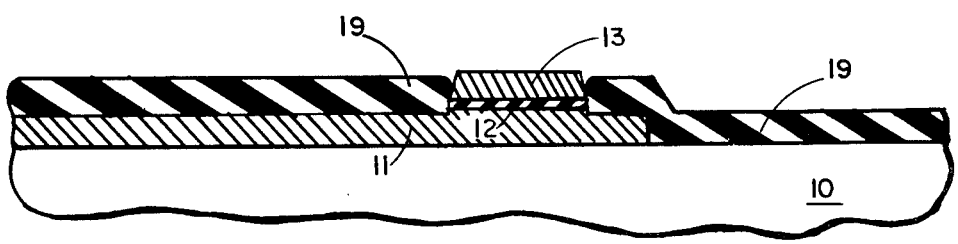
FIG. 1h is an eighth step in the process sequence according to the present invention, showing the removal of the photoresist layer portion thereby lifting off the dielectric layer portion above the second layer of superconductive material.

FIG. 1h shows the next step in the process sequence in which the photoresist layer portion 16 is removed by dissolution in a suitable solvent. Once the photoresist layer is removed, the overlying dielectric layer portion 19 is lifted off and thereby removed.

Figure 1I:
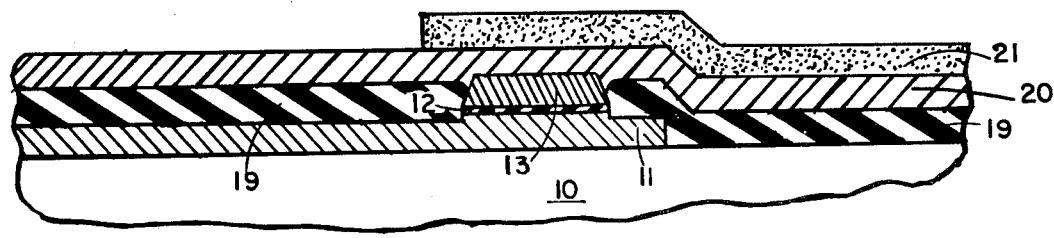
FIG. 1i shows a ninth step in the process sequence according to the present invention, showing the deposition of a third superconductive conductive layer over the entire exposed major surface, and the deposition of a photoresist layer and the etching of the layer to define the upper electrode geometry.

FIG. 1i shows the next step in the process sequence in which a third niobium layer 20 is deposited over the entire surface of the composite, and in particular over the dielectric layer 19 and the remaining portion 13 of the second niobium layer. In-situ sputter cleaning of the substrate immediately prior to the third niobium layer deposition may be used to produce a superior electrical contact between the second and third niobium layers. The niobium layer 20 preferably has a thickness of about 3500 angstroms and is deposited by any suitable technique such as electron beam evaporation or sputtering.

A layer of photoresist 21 is then deposited over the niobium layer 20 and suitably patterned to define the upper electrode geometry.

Figure 1J:
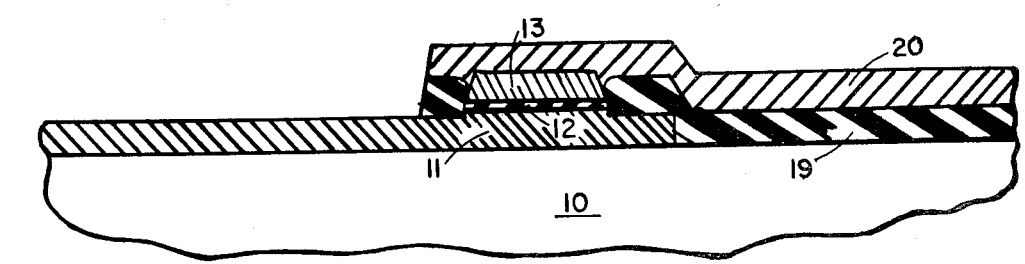
FIG. 1j shows a tenth step in the process sequence according to the present invention, showing the formation of the final device structure according to the present invention.

FIG. 1j shows the final step in the process sequence in which the photoresist layer portion 21 is used as a mask and the composite structure is etched. Etching is continued until the third niobium layer 20 is etched entirely through the dielectric layer 19 is etched entirely through down to the surface of the first niobium layer 11.

Following the etching step some final process steps are performed such as removing the photoresist and applying suitable contact to the first superconductive layer 11 and the third superconductive layer 20.

While the invention has been illustrated and described as embodied in a Process for In-Situ Formation of Niobium-Insulator-Niobium Josephson Tunnel Junction Devices, it is not intended to be limited to the details shown, since various modifications and structural changes may be made in any way from the spirit of the present invention.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A method of forming a superconductor-barrier-superconductor junction device comprising the steps of:
   depositing a first superconductive layer on a substrate;
   forming a barrier layer on said first superconductive layer;
   depositing a superconductive layer on said barrier layer;
   depositing a layer of photoresist over said second superconductive layer;
   patterning said layer of photoresist to form a mask;
   etching said second superconductive layer, said barrier layer, and a small portion of said first superconductive layer using said layer of photoresist as a mask to form a mesa structure;
   depositing a dielectric layer over said mesa structure; and
   dissolving said photoresist layer, thereby lifting off the portion of said dielectric layer overlying said second superconductive layer.

2. A method as defined in claim 1, wherein said first superconductive layer is niobium.

3. A method as defined in claim 1, wherein said second superconductive layer is niobium.

4. A method as defined in claim 1, further comprising the steps of depositing a third superconductive layer over said dielectric layer and the exposed surface portion of said second superconductive layer
   depositing a layer of photoresist over said third superconductive layer;
   patterning said layer of photoresist to a predetermined pattern;
   etching said composite structure defined by said photoresist pattern to said first superconductive layer, thereby opening a contact window to said first superconductive layer.

5. A method as defined in claim 1, wherein said dielectric layer is selected from the group consisting of silicon dioxide and silicon monoxide.

6. A method as defined in claim 1, wherein at least one of said depositing steps comprise sputtering.

7. A method as defined in claim 1, wherein at least one of said steps of depositing comprise evaporation.

8. A method as defined in claim 1, wherein said step of forming a dielectric layer comprises depositing silicon dioxide.

9. A method as defined in claim 1, wherein said barrier layer is formed by admission of an oxidizing gas into the deposition chamber to form a controlled thickness layer $Nb_2O_5$.

10. A method of forming a superconductor-barrier-superconductive junction device comprising the steps of:

in controlled ambient depositing a first superconductive layer on a substrate;

forming a barrier layer on said first superconductive layer without removing the substrate and depositing a second superconductive layer on said barrier layer;

depositing a layer of photoresist over said second superconductive layer;

patterning said layer of photoresist to form a mask;

etching said second superconductive layer, said barrier layer, and a small portion of said first superconductive layer using said layer of photoresist as a mask to form a mesa structure;

removing said layer of photoresist and depositing a dielectric layer;

depositing a second layer of photoresist defining a contact; and forming a contact opening to the second superconductive layer of the mesa structure.

* * * * *